(12) United States Patent
Lee et al.

(10) Patent No.: US 7,345,882 B2
(45) Date of Patent: Mar. 18, 2008

(54) SEMICONDUCTOR MODULE WITH HEAT SINK AND METHOD THEREOF

(75) Inventors: Hae-Hyung Lee, Suwon-si (KR);
Sang-Wook Park, Seongnam-si (KR);
Joong-Hyun Baek, Suwon-si (KR);
Jin-Yang Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 220 days.

(21) Appl. No.: 10/958,392

(22) Filed: Oct. 6, 2004

(65) Prior Publication Data

US 2005/0201063 A1 Sep. 15, 2005

(30) Foreign Application Priority Data

Mar. 15, 2004 (KR) .................... 10-2004-0017425

(51) Int. Cl.
*H05K 7/20* (2006.01)
*H01L 23/36* (2006.01)
(52) U.S. Cl. .................. 361/710; 361/709; 361/684; 361/719; 361/715; 257/719
(58) Field of Classification Search ............... 361/715, 361/709, 710, 684, 719; 257/719
See application file for complete search history.

(56) References Cited

U.S. PATENT DOCUMENTS

| | | | | |
|---|---|---|---|---|
| 4,344,106 A | * | 8/1982 | West et al. ................. | 361/717 |
| 4,707,726 A | * | 11/1987 | Tinder ......................... | 174/252 |
| 4,756,081 A | * | 7/1988 | Penn ............................ | 29/832 |
| 4,896,168 A | * | 1/1990 | Newman et al. ............ | 347/245 |
| 5,109,318 A | * | 4/1992 | Funari et al. ................ | 361/710 |
| 5,184,281 A | * | 2/1993 | Samarov et al. ............ | 361/704 |
| 5,709,263 A | * | 1/1998 | Mira ........................... | 165/80.3 |
| 5,892,660 A | * | 4/1999 | Farnworth et al. .......... | 361/728 |
| 5,946,190 A | * | 8/1999 | Patel et al. .................. | 361/700 |
| 5,966,287 A |   | 10/1999 | Lofland et al. |   |
| 6,031,727 A | * | 2/2000 | Duesman et al. ........... | 361/761 |
| 6,093,961 A | * | 7/2000 | McCullough ............... | 257/718 |

(Continued)

FOREIGN PATENT DOCUMENTS

KR 2001-0026717 4/2001

(Continued)

*Primary Examiner*—Anatoly Vortman
(74) *Attorney, Agent, or Firm*—Harness, Dickey & Pierce, P.L.C.

(57) ABSTRACT

A semiconductor module, including a semiconductor device mounted on a printed circuit board (PCB), the PCB having an electrical connection to the semiconductor module, and a heat sink in direct contact with the semiconductor device, the heat sink being formed with a first end and a second end, the first end and the second end being formed with different heights, wherein the semiconductor module allows air flow to pass through the semiconductor module, radiating heat away from the heat sink. Another semiconductor module, including a semiconductor device mounted on a PCB, a heat sink in direct contact with the semiconductor device, the heat sink having a first portion and a second portion, wherein the first portion has a flat shape and is in direct contact with the semiconductor device and the second portion has a corrugated shape and is not in contact with the semiconductor device, wherein the semiconductor module allows air flow to pass through the semiconductor module, radiating heat away from the heat sink.

23 Claims, 6 Drawing Sheets

U.S. PATENT DOCUMENTS

| | | | |
|---|---|---|---|
| 6,119,765 A * | 9/2000 | Lee ............................ | 165/80.3 |
| 6,233,150 B1 * | 5/2001 | Lin et al. ..................... | 361/704 |
| 6,449,156 B1 * | 9/2002 | Han et al. .................... | 361/704 |
| 6,765,797 B2 * | 7/2004 | Summers et al. ............ | 361/704 |
| 6,775,139 B2 * | 8/2004 | Hsueh ......................... | 361/697 |
| 6,839,232 B2 * | 1/2005 | Elo et al. ..................... | 361/690 |
| 6,888,719 B1 * | 5/2005 | Janzen et al. ................ | 361/687 |
| 7,079,396 B2 * | 7/2006 | Gates et al. ................. | 361/719 |
| 7,082,032 B1 * | 7/2006 | Barsun et al. ............... | 361/703 |
| 7,106,595 B2 * | 9/2006 | Foster et al. ................. | 361/721 |
| 2002/0001180 A1 * | 1/2002 | Kawamura ................... | 361/715 |
| 2002/0041487 A1 * | 4/2002 | McCullough et al. ........ | 361/704 |
| 2004/0130873 A1 * | 7/2004 | Hsueh ......................... | 361/697 |
| 2004/0250989 A1 * | 12/2004 | Im et al. ..................... | 165/80.1 |

FOREIGN PATENT DOCUMENTS

KR          2003-0078301          10/2003

* cited by examiner

SEMICONDUCTOR MODULE WITH HEAT SINK AND METHOD THEREOF

CROSS REFERENCE TO RELATED APPLICATIONS

This U.S. non-provisional application claims priority under 35 U.S.C. §119 of Korean Patent Application No. 2004-17425, filed on Mar. 15, 2004, the entire contents of which are incorporated herein by reference.

BACKGROUND OF THE INVENTION

1. Field of the Invention

The present invention relates generally to a semiconductor module, and more particularly, to a semiconductor module including a heat sink and method thereof.

2. Description of the Related Art

Recently, semiconductor products have generally become more integrated. A semiconductor module may include a plurality of semiconductor devices mounted on a printed circuit board (PCB). A conventional semiconductor module may include a dual in-line memory module (DIMM) which may include a plurality of semiconductor devices. The conventional DIMM has been defined by the Joint Electron Device Engineering Council (JEDEC).

Figure 1:
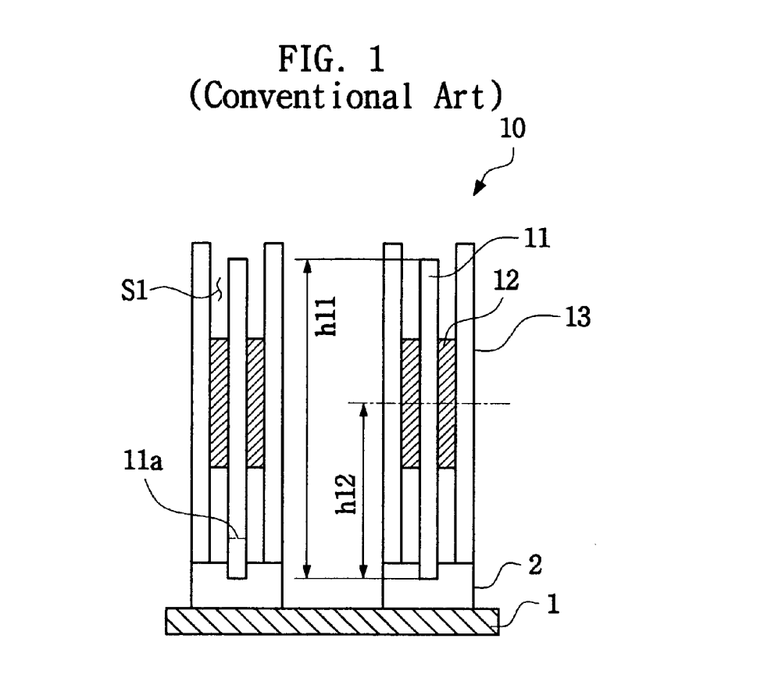
FIG. 1 illustrates a cross-sectional view of a semiconductor module by conventional methods.

FIG. 1 illustrates a cross-sectional view of a conventional semiconductor module 10. Referring to FIG. 1, the semiconductor module 10 may include a PCB 11, semiconductor devices 12 and heat sinks 13.

The PCB 11 may include a plurality of semiconductor devices 12 mounted on both sides thereof. The PCB 11 may include a connection terminal portion 11a at the lower end which may provide an electrical connection with a module socket 2. The semiconductor device 12 may be located adjacent to the center of the PCB 11. The heat sink 13 may be in contact with the semiconductor device 12 and may radiate heat generated by the semiconductor device 12. The module socket 2 may be mounted on a motherboard 1.

In a conventional DIMM for a computer server, the height h11 of the PCB 11 may be 30.48 mm (i.e. 1.2 inches). The height of the connection terminal portion 11a may be between about 2 mm and 2.5 mm. The height h12 between the center of the semiconductor device 12 and the lower end of the PCB 11 may be 17.24 mm.

In the conventional semiconductor module, a distance from the center of the semiconductor device 12 to the motherboard 1 may be 17 mm or more. This distance may prevent heat radiating from the semiconductor device 12 to the motherboard 1 through the PCB 11, as closer contact may be necessary for proper heat radiation. Further, a first space S1 between the PCB 11 and the heat sink 13 may be below a threshold distance, which may reduce the efficiency of heat radiation.

SUMMARY OF THE INVENTION

An exemplary embodiment of the present invention is a semiconductor module, including a semiconductor device mounted on a printed circuit board (PCB), the PCB having an electrical connection to the semiconductor module, and a heat sink in direct contact with the semiconductor device, the heat sink being formed with a first end and a second end, the first end and the second end being formed with different heights.

Another exemplary embodiment of the present invention is a method of radiating heat in a semiconductor module, including mounting a semiconductor device on a PCB, and connecting a heat sink to the semiconductor device, the heat sink being in direct contact with the semiconductor device, the heat sink being formed with a first end and a second end, the first end and the second end being formed with different heights.

Another exemplary embodiment of the present invention is a method of radiating heat in a semiconductor module, including mounting a semiconductor device on a printed circuit board (PCB), and connecting a heat sink to the semiconductor device, the heat sink having a first portion and a second portion, wherein the first portion has a flat shape and is in direct contact with the semiconductor device and the second portion has a corrugated shape and is not in contact with the semiconductor device.

Another exemplary embodiment of the present invention is a semiconductor module, including a semiconductor device mounted on a PCB, a heat sink in direct contact with the semiconductor device, the heat sink having a first portion and a second portion, wherein the first portion has a flat shape and is in direct contact with the semiconductor device and the second portion has a corrugated shape and is not in contact with the semiconductor device.

BRIEF DESCRIPTION OF THE DRAWINGS

The present invention will become more apparent by describing in detail exemplary embodiments thereof with reference to the attached drawings in which.

DETAILED DESCRIPTION OF THE EXEMPLARY EMBODIMENTS OF THE INVENTION

Hereinafter, exemplary embodiments of the present invention will be described in detail with reference to the accompanying drawings.

In the Figures, the same reference numerals are used to denote the same elements throughout the drawings.

Figure 2:
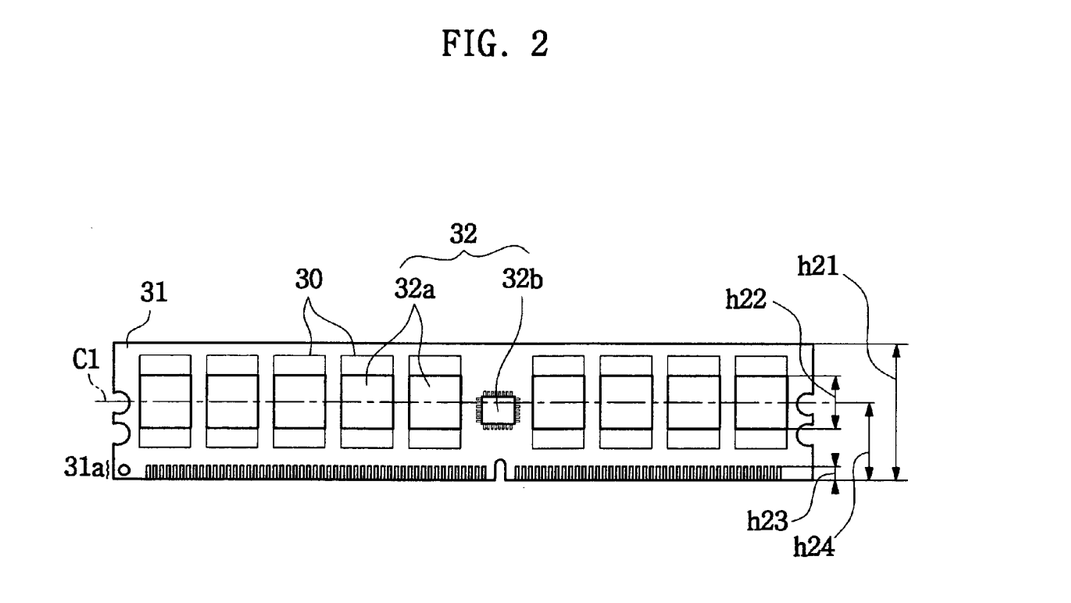
FIG. 2 illustrates a front-view of a printed circuit board (PCB) according to an exemplary embodiment of the present invention.

FIG. 2 illustrates a front-view of a printed circuit board (PCB) according to an exemplary embodiment of the present invention.

In an exemplary embodiment of the present invention, referring to FIG. 2, the PCB 31 may include semiconductor devices 32a within a semiconductor module 30. The semiconductor device 32 may be mounted on the PCB 31. The PCB 31 may include a connection terminal portion 31a which may provide an electrical connection with a module socket (not shown) at the lower end thereof. The semiconductor device 32 may include a data storage element, for example a memory device 32a, and a phase lock loop (PLL) circuit 32b. A condenser chip may be mounted on the PCB 31. Condenser chips are well known in the art and will not be described further for the sake of brevity.

In an exemplary embodiment of the present invention, a substrate height h21 (i.e. a height of the PCB 31) may be between 1.5 times and 4 times greater than a device height h22 (i.e. a distance between an upper end and lower end of the memory device 32a) when the memory device 32a is mounted on the PCB 31.

In another exemplary embodiment of the present invention, the substrate height h21 may be between 21 mm and 24 mm.

In another exemplary embodiment of the present invention, the device height h22 of the semiconductor device 32 may be between 10 mm and 12 mm.

In another exemplary embodiment of the present invention, the connection terminal portion 31a may have a 168-pin configuration and its height h23 may be between 2 mm and 2.5 mm.

In another exemplary embodiment of the present invention, the height h24 (i.e. the distance from center line C1 of the memory device 32a to the lower end of the PCB 31) may be between 7 mm and 14 mm.

In another exemplary embodiment of the present invention, a distance between the center line of a semiconductor device and the lower end of a PCB may be between 7 mm and 14 mm, in contrast to conventional methods which may have the distance between the center line of a semiconductor device, such as a memory device and the lower end of a PCB, being between 11 mm and 21 mm. Accordingly, a heat propagation distance from a semiconductor device 32 to a motherboard through a PCB 31 may be reduced with this reduced distance, thus increasing the amount of heat radiated in the semiconductor device 32.

Figure 3:
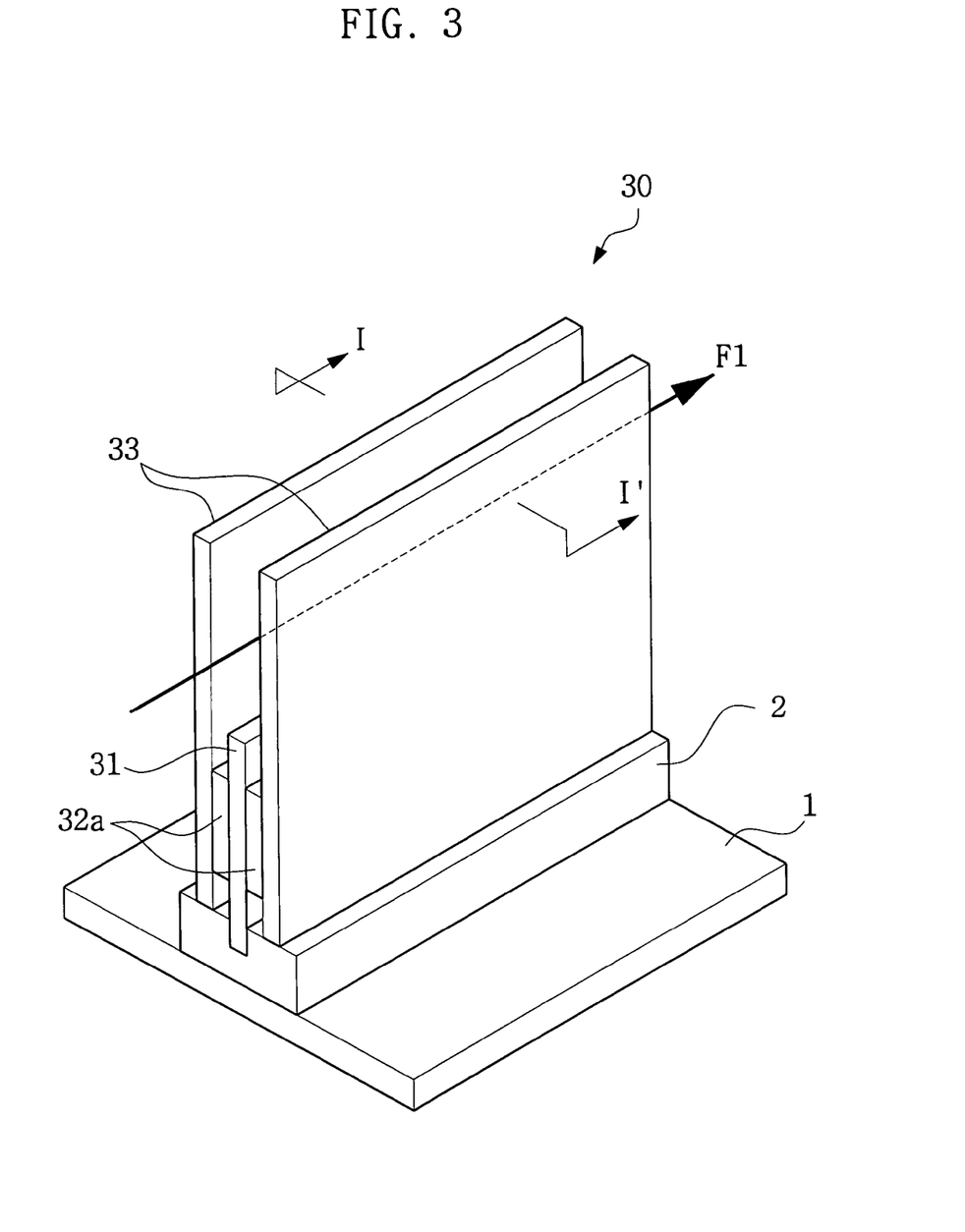
FIG. 3 illustrates a perspective view of a semiconductor module according to an exemplary embodiment of the present invention.

FIG. 3 illustrates a perspective view of a semiconductor module according to an exemplary embodiment of the present invention. Referring to FIG. 3, semiconductor module 30 may include one or more heat sinks 33.

Figure 4:
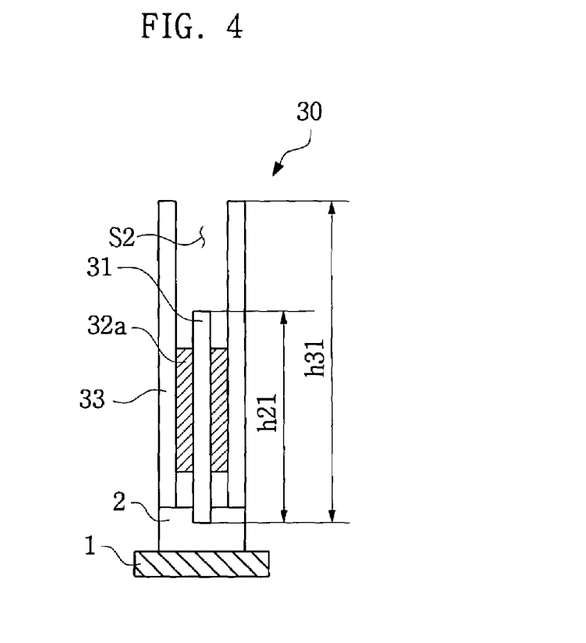
FIG. 4 illustrates a cross-sectional view taken along a line of I-I of FIG. 3.

FIG. 4 illustrates a cross-sectional view taken along a line of I-I of FIG. 3.

In another exemplary embodiment of the present invention, referring to FIGS. 3 and 4, the semiconductor module 30 may include a PCB 31, memory devices 32a and one or more heat sinks 33. The memory devices 32a may be mounted on both sides of the PCB 31.

In another exemplary embodiment, the semiconductor module 30 may be a duel in-line memory module (DIMM).

In another exemplary embodiment, the one or more heat sinks 33 may have a flat shape and may be in contact with the memory device 32a. A heat sink height h31 may be greater than a substrate height h21. For example, the heat sink height h31 may be between 1.2 times and 3 times greater than the substrate height h21.

In an example of the exemplary embodiment of the present invention, the heat sink height h31 may be between 23 mm and 43 mm.

In another exemplary embodiment of the present invention, the substrate height h21 may be less than the heat sink height h31. The difference between the substrate height h21 and the heat sink height h31 may induce a second space S2 between the one or more heat sinks 33. Further, air flow F1, which may be provided by a ventilator (not shown), may pass through the second space S2 without an obstruction. Heat accumulated on the top end of the PCB 31 as well as heat deposited in the one or more heat sinks 33 may be radiated by the air flow F1.

Figure 5:
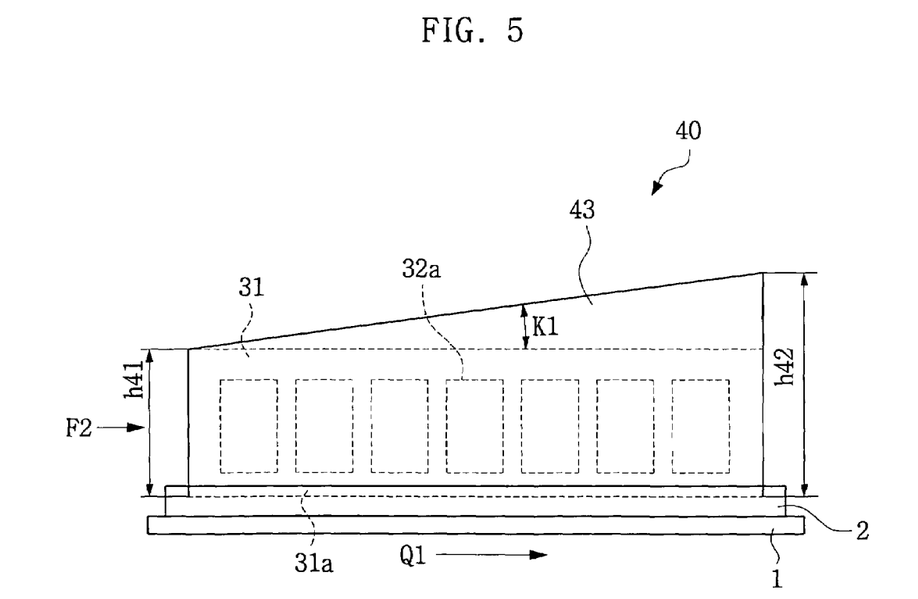
FIG. 5 illustrates a front-view of a semiconductor module according to an exemplary embodiment of the present invention.

FIG. 5 illustrates a front-view of a semiconductor module according to an exemplary embodiment of the present invention.

In another exemplary embodiment of the present invention, referring to FIG. 5, the semiconductor module 40 may include a PCB 31, memory devices 32a and one or more heat sinks 43.

In another exemplary embodiment of the present invention, the semiconductor module 40 may be a DIMM.

In another exemplary embodiment of the present invention, as shown in FIG. 5, the one or more heat sinks 43 may have a height h42 which increases in the direction Q1.

In another exemplary embodiment of the present invention, as shown in FIG. 5, the one or more heat sink 43 may each have a trapezoidal shape.

In another exemplary embodiment of the present invention, the temperature of the air flow F2 may be higher at its out-flow as compared to its in-flow through semiconductor module 40. As the air flow F2 passes between the one or more heat sinks 43, heat from the one or more heat sinks 43 may be transferred (i.e., radiated) to the air flow F2. The heat sink height h42 at of the out-flow of air flow F2 may be formed larger than the heat sink height h41 at the in-flow of air flow F2. As illustrated in FIG. 5, a differential between h41 and h42 may cause an incline in the one or more heat sinks 43.

In an example of the exemplary embodiment of the present invention, an inclination angle K1 may be between 5° and 30°.

In another exemplary embodiment of the present invention, a relatively constant low temperature of the DIMM 40 may be maintained by the air flow F2 passing between the one or more heat sinks 43 in the direction Q1. Maintaining a relatively constant low temperature of the DIMM 40 may reduce a malfunction of the memory device 32a due to heat and/or may improve the operational reliability of the DIMM 40.

Figure 6:
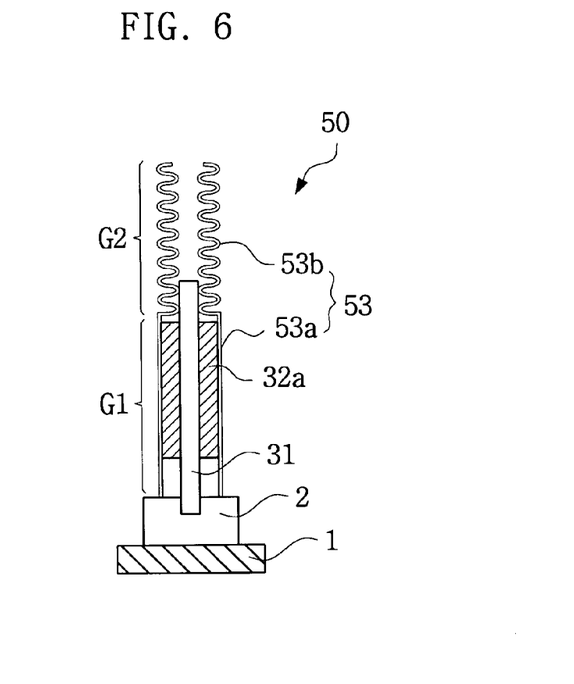
FIG. 6 illustrates a cross-sectional view of a semiconductor module 50 according to another exemplary embodiment of the present invention.

FIG. 6 illustrates a cross-sectional view of a semiconductor module 50 according to another exemplary embodiment of the present invention. The semiconductor module 50 may include a PCB 31, memory devices 32a, and/or one or more heat sinks 53.

In another exemplary embodiment of the present invention, the semiconductor module 50 may be a DIMM.

In another exemplary embodiment of the present invention, the one or more heat sinks 53 may include a flat type contact region G1. The flat type contact region G1 may be formed in direct contact the memory device 32a, and/or a corrugated type remaining region G2 which may contain irregularities.

In another exemplary embodiment of the present invention the irregularities may include concave, convex, saw-toothed, squared-toothed and/or wavy shapes.

In another exemplary embodiment of the present invention, the corrugated type remaining region G2 may be manufactured through a press process.

In another exemplary embodiment of the present invention, the corrugated type remaining region G2 may have an increased area of air contact, allowing improved heat radiation effect.

Figure 7:
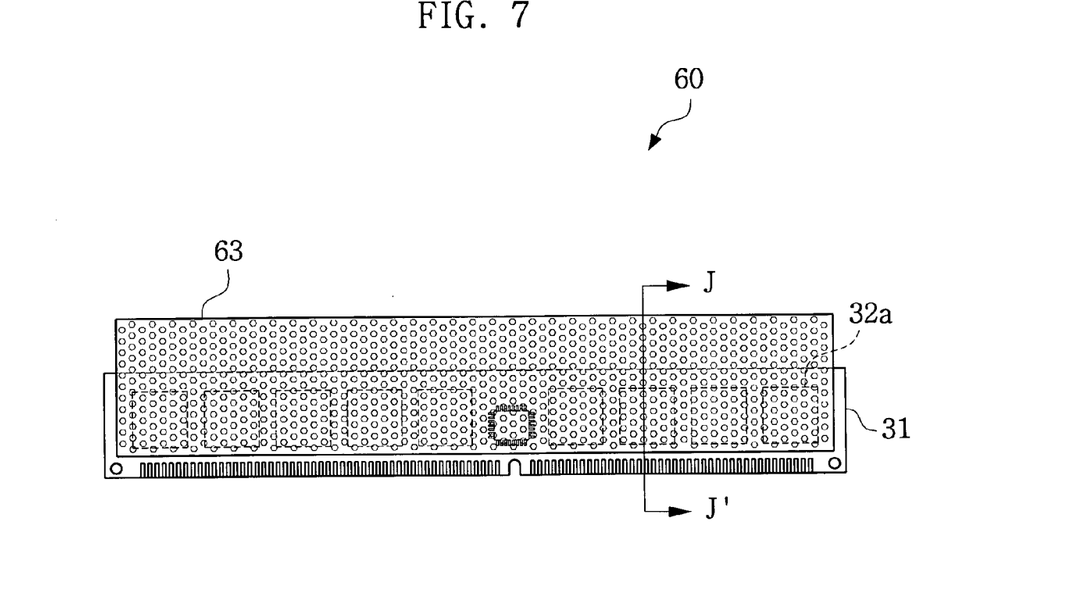
FIG. 7 illustrates a front view of a semiconductor module 60 according to another exemplary embodiment of the present invention.

FIG. 7 illustrates a front view of a semiconductor module 60 according to another exemplary embodiment of the present invention.

Figure 8:
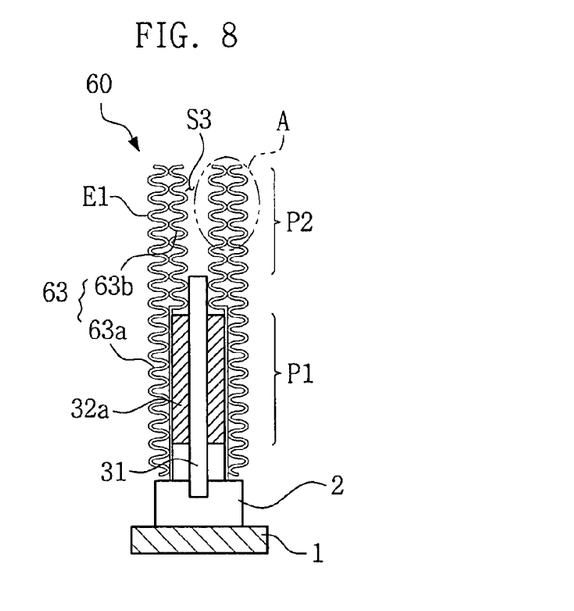
FIG. 8 illustrates a cross-sectional view taken along a line of J-J of FIG. 7.

FIG. 8 illustrates a cross-sectional view taken along a line of J-J of FIG. 7.

In another exemplary embodiment of the present invention, referring to FIGS. 7 and 8, the semiconductor module 60 may include a PCB 31, memory devices 32a, and/or one or more heat sinks 63.

In another exemplary embodiment of the present invention, the semiconductor module 60 may be a DIMM.

In another exemplary embodiment of the present invention, the one or more heat sinks 63 may include a heat pipe which may radiate heat using a fluid. The one or more heat sinks 63 may each include a first metal member 63a and a second metal member 63b. The second metal member 63b may be in contact with the first metal member 63a.

In another exemplary embodiment of the present invention, forming the one or more heat sinks 63 as a heat pipe may allow greater thermal conductivity as compared to a copper pipe. The thermal conductivity of the heat pipe (i.e., through a fluid circulation within the heat pipe) may allow heat applied at one portion of the heat pipe to be radiated across the entire heat pipe at a higher rate.

In another exemplary embodiment of the present invention, the one or more heat sinks 63 may include an evaporation portion P1. The evaporation portion P1 may evaporate the fluid in a contact region contacting the memory device 32a.

In another exemplary embodiment of the present invention, the one or more heat sinks 63 may further include a condensation portion P2. The condensation portion P2 may condense the fluid in the remaining region. The condensed fluid may adhere to an inner area of irregularities E1 of the condensation portion P2.

In another exemplary embodiment of the present invention, the condensed fluid may be lowered by gravity to the evaporation portion P1. The condensed fluid may be evaporated in the evaporation portion P1. For example, similar to a refrigeration process, the one or more heat sinks 63 may absorb heat at the evaporation portion P1 and may radiate the heat at the condensation portion P2.

In another exemplary embodiment of the present invention, a third space S3 between the one or more heat sinks 63 may be formed greater than according to conventional methods, which may improve heat radiation.

Figure 9:
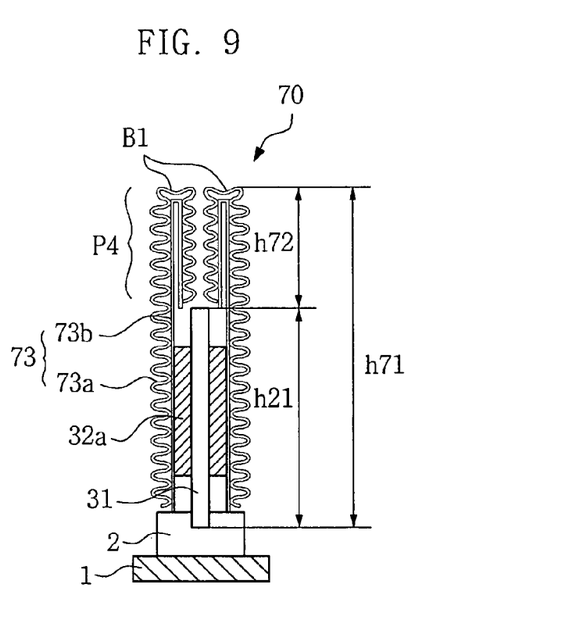
FIG. 9 illustrates a cross-sectional view of a semiconductor module 70 according to another exemplary embodiment of the present invention.

FIG. 9 illustrates a cross-sectional view of a semiconductor module 70 according to another exemplary embodiment of the present invention.

In another exemplary embodiment of the present invention, referring to FIG. 9, the semiconductor module 70 may include a PCB 31, memory devices 32a, and/or heat sinks 73.

In another exemplary embodiment of the present invention, the semiconductor module 70 may be a DIMM.

Figure 10:
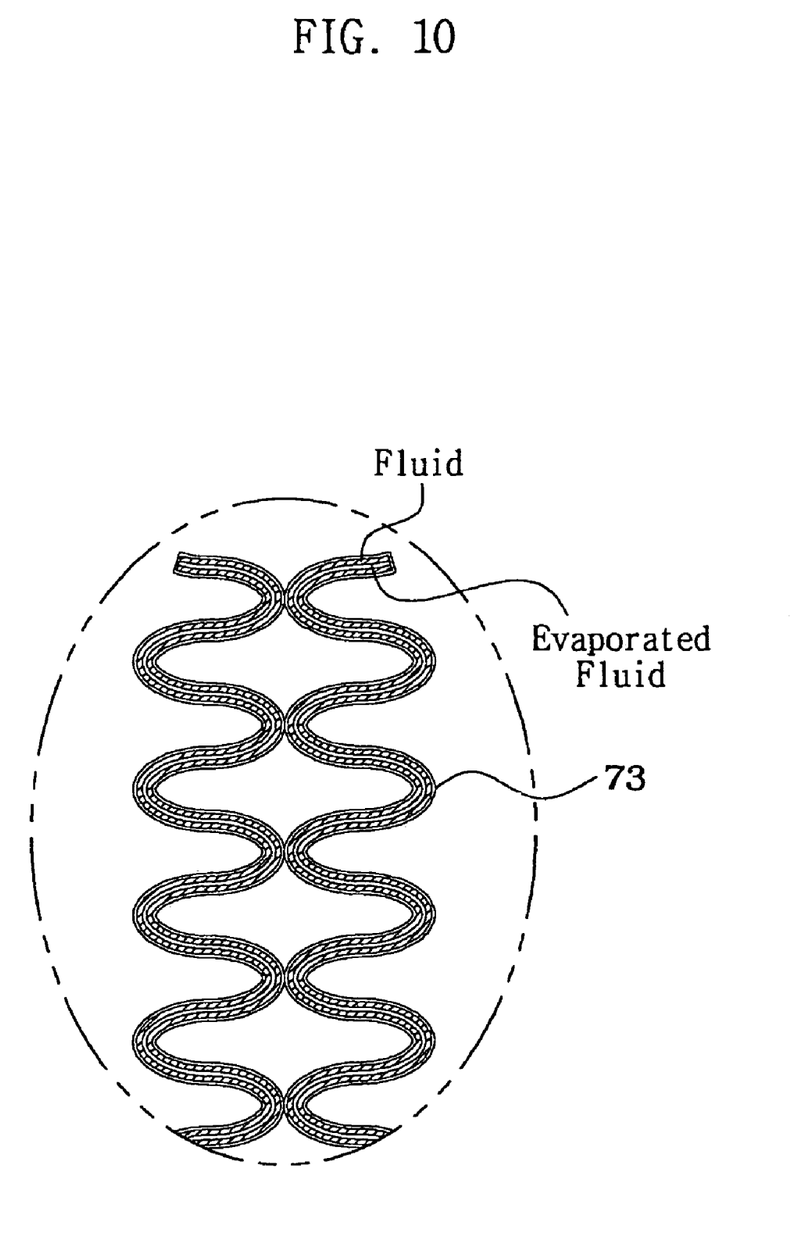
FIG. 10 is an enlarged diagram of a heat sink formed as a heat pipe according to the modification of the exemplary embodiment as shown in FIG. 9.

In another exemplary embodiment of the present invention, referring to FIG. 10, the heat sink 73 may be formed as a heat pipe. The heat sink 73 may include a corrugated type first metal member 73a and a flat type second metal member 73b. The heat sink 73 may further include a bent portion B1 at the upper end of the flat type second metal member 73b. The angle of the bend of the bent portion B1 may be 180°.

By conventional methods, a space between heat sinks may not be great enough to bend the heat sinks. However, in another exemplary embodiment of the present invention, the substrate height h21 may be reduced relative to the heat sink height h71, thereby forming a space between the heat sinks 73 in which the heat sink 73 may be bent, as illustrated with the bent portion B1 of the heat sink 73.

In another exemplary embodiment of the present invention, the heat sink 73 may include an overlapping portion. The overlapping portion may be a region where the bent portion has increased the thickness of the heat sink 73 with an overlap of the bent portion B1 and a remaining unbent portion, as illustrated in FIG. 9. The height of the overlapping portion may be equal to or smaller than the height h72. The height h72 may be determined by subtracting the substrate height h21 from the heat sink height h71.

In another example of the exemplary embodiment of the present invention, the heat sink height h71 may be between 28 mm and 32 mm.

In another exemplary embodiment of the present invention, a condensation portion P4 may be formed to be approximately twice as large as the condensation portion P2 of FIG. 8.

In another exemplary embodiment of the present invention, a substrate height relative to a heat sink height may be reduced, thereby creating a heat radiation space between heat sinks. A heat propagation distance from a semiconductor device to a motherboard through a PCB may be reduced and convection may occur in the heat radiation space. Thus, the efficiency of heat radiation may be improved.

The exemplary embodiments of the present invention being thus described, it will be obvious that the same may be varied in many ways. For example, although above-described exemplary embodiments of the present invention are described with the condensed fluid including water and/or alcohol, the condensed fluid may be selected from a plurality of fluids, wherein the plurality of fluids have a boiling point which may be less than 100 C.°. Further, the above-described exemplary heat sinks may include a plurality of metal materials having good thermal conductivity. For example, copper and/or aluminum may be used as a material of a heat sink in any of the above-described exemplary heat sinks.

Further, above-described exemplary embodiments have been described with respect to a DIMM. However, the above described exemplary embodiments may be applied to any semiconductor device. For example, embodiments of the above-described heat sinks may be applied to a processor in a computer server.

Further, the bent portion in above-described embodiments has been described as being 180 degrees. However, the bent portion may have an any angle such that the bent portion indicates that the portions of the heat sink are not straight.

Further, above-described exemplary embodiments have been described with the substrate height h21 being 1.5 to 4 times greater than the device height h22. However, multiples outside of the above-defined range may be used with the exemplary embodiments of the present invention.

Further, above-described substrate heights have been described as being between 21 mm and 24 mm. However, it is understood that substrates having heights outside of the above-defined range may be used with the exemplary embodiments of the present invention.

Further, the above-described connection terminal 31a has been described as having a 168-pin configuration with a height between 2 mm and 2.5 mm. However, it is understood that the connection terminals in the above-described exemplary embodiments may be configured for any pin configuration, and the connection terminals may have heights outside of the above-defined range.

Further, above-described exemplary embodiments of a heat sink having an inclination angle K1 has been described as having a trapezoidal shape. However, it is understood that any inclined shape may be used. For example, a triangular shape may be used.

Further, the inclination angle K1 has been described above as being between 5° and 30°. However, the angle K1 may be any angle so as to induce a differential in the height between the ends of a heat sink.

Further, the shape of the corrugated portion has been described as including concave, convex, saw-toothed, squared-toothed and/or wavy shapes. However, any shape allowing air flow to pass the heat sink may be used.

Further, above-described embodiments of exemplary heat sinks have been described in exclusion. For example, first the one or more heat sinks 33 were described, then the one or more heat sinks 43 were described, and so on. However, it is understood that all of the above-described heat sinks may be used alone or in any combination with either other above-described heat sinks and/or with conventional heat sinks.

Such variations are not to be regarded as departure from the spirit and scope of the exemplary embodiments of the present invention, and all such modifications as would be obvious to one skilled in the art are intended to be included within the scope of the following claims.

What is claimed is:

1. A semiconductor module, comprising:
    a semiconductor device mounted on a printed circuit board (PCB), the PCB having an electrical connection to the semiconductor device; and
    a heat sink in direct contact with the semiconductor device, the heat sink being formed with a first end having a height $h_1$, a second end having a height $h_2$, wherein the expression $h_1 \neq h_2$ is satisfied, and an inclined side connecting the first end to the second end such that the heat sink has a trapezoidal profile extending along a z-axis.

2. The semiconductor module of claim 1, wherein the printed circuit board has a height $h_p$, the semiconductor device has a height $h_s$ and the expression $1.5h_s \leq h_p \leq 4h_s$ is satisfied.

3. The semiconductor module of claim 1, wherein the printed circuit board has a height $h_p$ and the expressions $1.2h_p \leq h_1 \leq 3h_p$ and $1.2h_p \leq h_2 \leq 3h_p$ are satisfied.

4. The semiconductor module of claim 1, wherein the printed circuit board has a height $h_p$ and the expression $21 \text{ mm} \leq h_p \leq 24 \text{ mm}$ is satisfied.

5. The semiconductor module of claim 1, wherein the expressions are $23 \text{ mm} \leq h_1 \leq 43 \text{ mm}$ and $23 \text{ mm } h_2 \leq 43 \text{ mm}$ are satisfied.

6. The semiconductor module of claim 4, wherein the expressions are $23 \text{ mm} \leq h_1 \leq 43 \text{ mm}$ and $23 \text{ mm} \leq h_2 \leq 43 \text{ mm}$ are satisfied.

7. A semiconductor module of claim 1, wherein the heat sink includes a flat portion and a corrugated portion.

8. The semiconductor module of claim 7, wherein the flat portion is in direct contact with the semiconductor device.

9. The semiconductor module of claim 7, wherein the corrugated portion is not in direct contact with the semiconductor device.

10. The semiconductor module of claim 1, wherein the heat sink is formed as a heat pipe for radiating heat using a fluid.

11. The semiconductor module of claim 10, wherein the heat sink includes a first metal member and a second metal member, the second metal member being in direct contact with the first metal member in a contact region.

12. The semiconductor module of claim 11, wherein the heat sink includes an evaporation portion evaporating the fluid in the contact region.

13. The semiconductor module of claim 12, wherein the evaporated fluid is condensed in a condensation portion.

14. The semiconductor module of claim 11, wherein the first metal member and the second metal member include a bent portion.

15. The semiconductor module of claim 14, wherein the bent portion has an angle of 180°.

16. The semiconductor module of claim 14, wherein the heat sink includes an overlapping portion, the overlapping portion being formed by an increased thickness from the bent portion.

17. The semiconductor module of claim 16, wherein a first height of the overlapping portion is equal to or smaller than a distance obtained by subtracting a second height of the PCB from a third height of the heat sink.

18. The semiconductor module of claim 10, wherein the boiling point of the fluid is between 25° C. and 100° C.

19. The semiconductor module of claim 10, wherein the fluid includes at least one of water and alcohol.

20. The semiconductor module of claim 7, wherein the first and second metal members include at least one of copper and aluminum.

21. The semiconductor module of claim 1, wherein the semiconductor device includes a plurality of memory devices.

22. The semiconductor module of claim 21, wherein the plurality of memory devices are mounted on at least one side of the printed circuit board.

23. The semiconductor module of claim 1, wherein the semiconductor module is a dual in-line memory module (DIMM).

* * * * *